(12) United States Patent  (10) Patent No.: US 8,915,489 B2
Feurer et al.  (45) Date of Patent: Dec. 23, 2014

(54) METHOD FOR PRODUCING A FLEXIBLE CIRCUIT CONFIGURATION

(71) Applicant: Cicor Management AG, Zürich (CH)

(72) Inventors: Ernst Feurer, Blaustein (DE); Bruno Holli, Ulm (DE); Alexander Kaiser, Schemmerhofen (DE); Karin Ruess, Stuttgart (DE)

(73) Assignee: Cicor Management AG, Zurich (CH)

( * ) Notice: Subject to any disclaimer, the term of this patent is extended or adjusted under 35 U.S.C. 154(b) by 0 days.

(21) Appl. No.: 13/859,171

(22) Filed: Apr. 9, 2013

(65) Prior Publication Data

US 2013/0263780 A1 Oct. 10, 2013

Related U.S. Application Data

(62) Division of application No. 12/896,450, filed on Oct. 1, 2010, now abandoned.

(30) Foreign Application Priority Data

May 4, 2010 (DE) .......................... 10 2010 016 781

(51) Int. Cl.
*H01L 21/687* (2006.01)
*H05K 3/00* (2006.01)

(52) U.S. Cl.
CPC .................. *H05K 3/00* (2013.01); *H05K 3/007* (2013.01); *H05K 2201/0154* (2013.01); *H05K 2203/0169* (2013.01); *H05K 2203/0271* (2013.01); *Y10S 269/90* (2013.01); *Y10S 269/903* (2013.01)
USPC .............................. 269/21; 269/900; 269/903

(58) Field of Classification Search
USPC .............................. 269/289 R, 302.1, 903, 21
See application file for complete search history.

(56) References Cited

U.S. PATENT DOCUMENTS

| 5,622,900 | A | 4/1997 | Smith |
| 5,700,297 | A * | 12/1997 | Vollaro ........................ 29/25.01 |
| 6,217,972 | B1 | 4/2001 | Beroz et al. |
| 6,245,646 | B1 * | 6/2001 | Roberts .......................... 438/464 |
| 6,328,296 | B2 * | 12/2001 | Tyveleijn ....................... 269/297 |
| 6,344,308 | B1 | 2/2002 | Kurita et al. |
| 6,458,234 | B1 | 10/2002 | Lake et al. |
| 6,513,796 | B2 * | 2/2003 | Leidy et al. ...................... 269/21 |
| 6,708,965 | B2 * | 3/2004 | Nuxoll et al. ................... 269/118 |
| 8,152,150 | B2 * | 4/2012 | Li et al. ........................... 269/305 |
| 8,276,898 | B2 * | 10/2012 | Avoyan et al. .................... 269/21 |
| 8,511,663 | B2 * | 8/2013 | Gong et al. ..................... 269/287 |
| 2007/0241201 | A1 | 10/2007 | Brown et al. |
| 2009/0223700 | A1 | 9/2009 | Youngner et al. |
| 2013/0263780 | A1 * | 10/2013 | Feurer et al. ................... 118/500 |

* cited by examiner

*Primary Examiner* — Lee D Wilson
(74) *Attorney, Agent, or Firm* — McCormick, Paulding & Huber LLP

(57) ABSTRACT

A method is specified for the production of a flexible circuit configuration, which allows the manufacturing of such flexible circuits on a carrier film cost-effectively and with high precision. For this purpose, the carrier film is fastened at the beginning of the method on a rigid frame, which encloses an inner area, and spans the inner area using an inner surface. After finishing of a layer structure and optionally additional method steps, structures for flexible circuit configurations which are created over the inner surface may be cut out easily by cutting the flexible circuit configurations out of the inner surface as a cutout. Through the fastening of the carrier film on the frame, it is ensured during the various method steps of the production of the flexible circuit configuration that the carrier film, which is flexible per se, always forms a level foundation for the various method measures, in particular the photolithographic structuring of layers of a layer structure.

5 Claims, 2 Drawing Sheets

METHOD FOR PRODUCING A FLEXIBLE CIRCUIT CONFIGURATION

CROSS REFERENCE TO RELATED APPLICATIONS

This application is a Divisional Application of U.S. application Ser. No. 12/896,450 filed Oct. 1, 2010 and claims priority of the German patent application No. DE 102010016781.9, filed on 4 May 2010, the disclosures of which are incorporated herein by reference in their entirety.

There are two related co-pending U.S. applications which were filed on the same day as the original U.S. application Ser. No. 12/896,450. The first entitled METHOD FOR PRODUCING A FLEXIBLE CIRCUIT CONFIGURATION, FLEXIBLE CIRCUIT CONFIGURATION, AND ELECTRICAL CIRCUIT CONFIGURATION HAVING SUCH A FLEXIBLE CIRCUIT CONFIGURATION claims the priority of the German patent application No. DE 102010016780.0, filed on 4 May 2010. The second entitled METHOD FOR PRODUCING A FLEXIBLE CIRCUIT CONFIGURATION claims the priority of the German patent application No. DE 102010016779.7, filed on 4 May 2010.

FIELD OF THE INVENTION

The invention relates to a method for producing a flexible circuit configuration and a manufacturing module of such a method.

BACKGROUND OF THE INVENTION

Flexible circuit configurations are advantageous, inter alia, for use in applications in which the circuit configuration must have permanent flexible properties, in particular, for example, in body implants or in objects which have at least limited flexibility in use, such as credit cards.

Flexible circuit configurations contain at least one insulating layer and at least one conductive layer, at least the conductive layer being structured in the surface. The terms insulating layer and conductive layer refer in this case and hereafter to the electrical properties of the layer materials. Frequently, at least two structured conductive layers are provided, which are spaced apart from one another by at least one insulating layer acting as a separation layer. The two conductive layers are typically conductively connected to one another in spots via through contacts through the separation layer, which is also structured in the surface for this purpose, so that a three-dimensional configuration of conductor structures arises. The structuring of the conductive layers and the insulating layers is typically performed by photolithography using different masks.

For a high precision during the structuring of a layer deposited over the entire surface, which is important in particular in the case of very small structure dimensions, the layer structure can be deposited on a rigid substrate, for example, on a silicon wafer. After the layer structure is deposited, optionally after further method steps of the production including possible equipment with discrete components on a surface of the flexible circuit configuration, the flexible circuit configuration is separated from the substrate. Since the layer structure itself is typically less than 0.1 mm thick, a flexible film can be connected to the layer structure, which can also have through contacts. The rigid substrate advantageously allows the handling of the circuit configuration during the production process, however, the separation from the substrate can result in damage of the finished flexible circuit configuration because of sensitivity of the layer structure to various typical detachment methods.

SUMMARY OF THE INVENTION

The invention is based on the object of specifying a cost-effective and reliable method for producing a flexible circuit configuration. A further object of the invention is to specify a manufacturing module usable within such a production method.

Solutions according to the invention are described in the independent claims. The dependent claims contain advantageous embodiments and refinements of the invention.

In the invention, a carrier film is used as the underlay for the deposition of the layer structure of the flexible circuit configuration, the carrier film being fastened on a frame which encloses an inner area, which is spanned by the film. The carrier film advantageously has edge surfaces pressing against the frame in one plane and the inner surface of the carrier film spanning the inner area of the frame is essentially level. The film can advantageously be held on the frame under elastic tension, which is uniform in the film plane. The layer structure having the at least one structured conductive layer for the flexible circuit configuration is deposited over the inner surface on the carrier film, one or more layers of the layer structure typically also being deposited over the edge surfaces of the carrier film, but not forming part of the flexible circuit configuration to be produced there and therefore also not being understood hereafter as the layer structure of the flexible circuit configuration. The creation of the layer structure can also, in a preferred embodiment, comprise at least one method step for solidifying a material, which is applied in free-flowing form, under elevated temperature, in particular at least 250° C., an electrically insulating polyamide layer being producible in particular by imidization. The material of the carrier film advantageously has a coefficient of thermal expansion which differs from the coefficient of thermal expansion of the frame material by not more than $10^{-5}$/K. The frame material is selected as resistant to chemical, thermal, and mechanical effects during the manufacturing process.

The carrier film can advantageously be fastened on the frame by gluing and/or lamination, the application of contact pressure forces and/or higher temperatures also being able to be provided. The carrier film advantageously comprises a polymer, in particular a polyimide. The carrier film can also contain fiber material, such as glass fibers, for mechanical reinforcement. The carrier film can also be constructed as multilayered per se.

After the deposition of the layer structure for the flexible circuit configuration on the carrier film, carrier film and layer structure form a flexible solid composite. The thickness of the carrier film is advantageously greater than the thickness of the layer structure. The composite of carrier film and layer structure can be subjected to further method steps, while the carrier film remains fastened unchanged on the frame. Such further method steps may be, for example, creating contact surfaces, applying solder bumps, equipping with discrete components, etc. A high precision of the orientation of the carrier film having the layer structure can advantageously be reliably ensured in a simple manner not only during the structuring of one or more layers of the layer structure but rather also during the mentioned further method steps by the dimensional stability of the rigid frame. In particular also the inner surface of the film, which is not directly connected to the frame itself, is held in a uniform position with respect to the frame by the fastening of the film on the rigid frame, so that both different masks for the structuring of different layers may be oriented precisely relative to previously created structured layers and also solder bumps or discrete components may be applied precisely in position with respect to previously produced structures. Positioning references for reproducible precise orientation can advantageously be provided for this purpose on the rigid frame and/or on the edge surface of the carrier film.

The rigid frame allows the simple handling of the flexible circuit configuration during multiple successive manufacturing steps, a manufacturing module which can be handled uniformly, and which contains the frame and the film fastened thereon having the layer structure, also being transportable between various manufacturing devices or manufacturing stations. Multiple flexible circuit configurations, which may also differ per se, may advantageously be processed over all processing steps.

After completion of all manufacturing steps which are to be performed with the carrier film fastened on the frame, the flexible circuit configuration can be cut out from the inner surface over the inner area as a partial surface, which can be performed in a particularly simple manner and without danger to the flexible circuit configuration due to the free spanning, e.g., by stamping or cutting, the latter also using a laser beam.

Advantageously, a rigid inner part can be laid in the inner area of the frame for individual manufacturing steps of the production method, which forms a mechanical support for the carrier film without being connected to the carrier film. On the one hand, this can thus prevent the carrier film from sagging down in the inner area under its intrinsic weight and mask structures from being imaged fuzzily on the layer to be structured during photolithographic structuring. On the other hand, the film having the layer structure can reliably support the lower side of the film in particular during manufacturing steps in which pressure forces are exerted on the side of the layer structure facing away from the carrier film and/or the frame. The inner part is preferably produced jointly with the frame from a flat plate, in that, for example, by laser beam cutting, an inner contour of the frame is created around an inner area and the cutout surface thus arising is used as the inner part. Frame and inner part advantageously then have equal thicknesses perpendicular to the plate surface from the beginning. Frame and inner part advantageously comprise the same material, preferably a stainless steel which is insensitive to solvents and temperatures of the various manufacturing steps.

The inner surface of the carrier film can advantageously also be processed from the side facing toward the inner area of the frame. In particular, openings can be produced through the carrier film and through contacts can preferably be produced in the openings. Such openings are advantageously created in the carrier film after depositing at least one conductive layer over the side of the carrier film facing away from the frame and/or the inner area and lead up to a conductor surface of a conductive layer, if necessary, the opening through the carrier film also being continued through an insulating layer between carrier film and a conductive layer. In particular, contact surfaces may be produced on the side of the carrier film opposite to the layer structure and facing toward the inner area, which are electrically connected via through contacts through the carrier film to at least one structured conductive layer of the layer structure. The surface facing toward the inner area can also be metal plated over the entire surface, for example, and form a shielding surface and/or an electrical ground surface, using which individual conductor surfaces within the layer structure are contacted via through contacts through the carrier film. A further layer structure can also be created on the side of the carrier film facing toward the inner area. Finally, it is also possible to create the layer structure only on the side of the carrier film facing toward the inner area.

Multiple flexible circuit configurations may advantageously be produced simultaneously in a common manufacturing module and subsequently be separated from the frame and from one another.

BRIEF DESCRIPTION OF THE DRAWINGS

The invention is explained in greater detail hereafter on the basis of preferred exemplary embodiments with reference to the drawings. In the figures.

DESCRIPTION OF THE PREFERRED EMBODIMENTS

Figure 1:
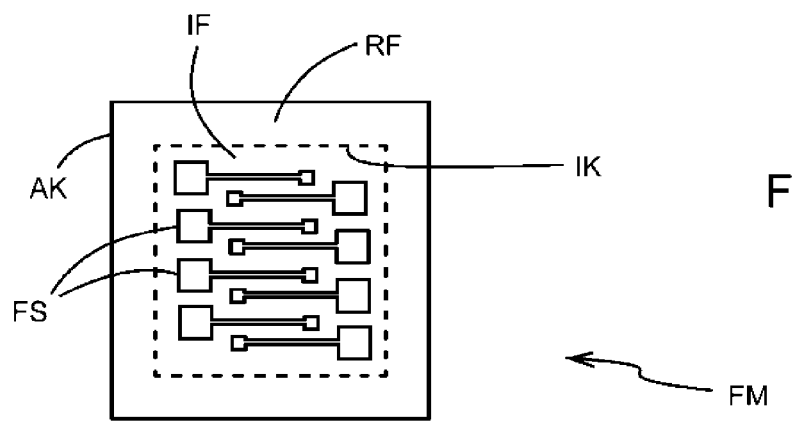
FIG. 1 shows a top view of a manufacturing module.

In the examples described hereafter, the relative dimensions of the individual components in the drawings are not shown to scale. In particular, the thickness of the film and the thickness of the layer structure or individual layers of the layer structure are shown greatly exaggerated.

Figure 2:
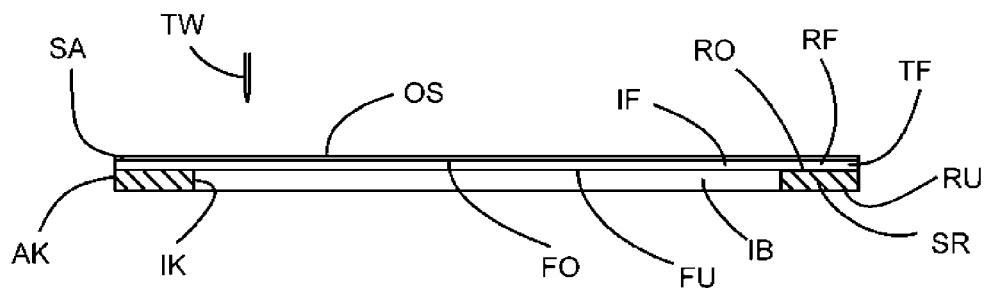
FIG. 2 shows a side view of FIG. 1.
Figure 3:
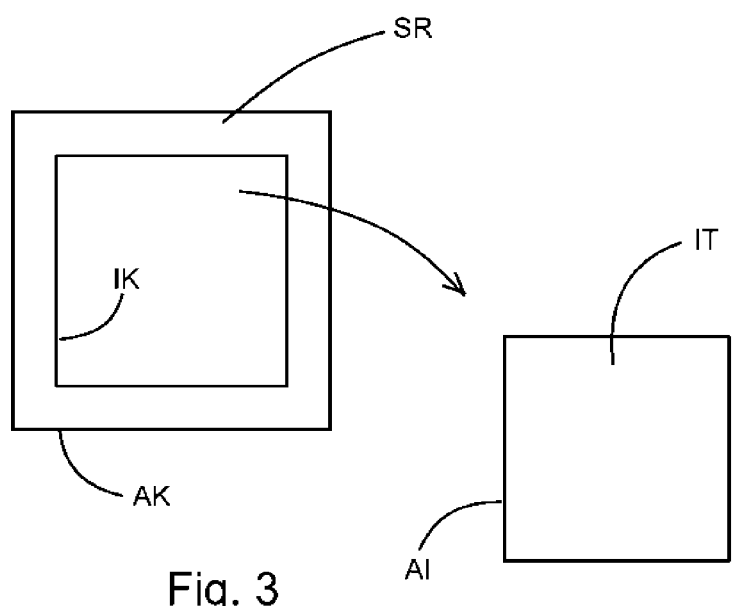
FIG. 3 shows a frame having cutout inner part.

FIG. 1 shows a manufacturing module FM in a view perpendicular to the surface of a layer structure for flexible circuits. Multiple flexible circuits FS are indicated by their contours. In FIG. 2, a sectional side view of FIG. 1 is shown in a different scale. FIG. 3 shows a preferred production of a rigid frame SR, which is used in the method or the manufacturing module, in which a cutout is produced from a closed plate surface along an inner contour IK. During the production of the cutout, an inner part IT arises as the cutout plate section, whose outline AI is less by the cutting width of the cutout than the inner contour IT of the rigid frame SR. The inner part IT can therefore be laid unbraced and also with slight lateral play if needed in the inner area IB, which is enclosed by the inner contour of the frame SR. The frame SR and the inner part IT advantageously have an identical plate thickness perpendicular to the plate surface. The outer contour of the rigid frame SR is identified by AK. In the outlined example, the rigid frame SR is shown having square inner contour IK and outer contour AK. The rigid frame can also have a different, preferably rotationally-symmetric regular shape such as a rectangular shape or a circular ring shape.

In the manufacturing module FM, a carrier film TF is fastened on a side of the frame referred to hereafter as the upper side RO, which is preferably glued and/or laminated on the upper side RO of the frame SR, during the fastening of the carrier film TF, the film preferably being elastically pre-tensioned isotropically on all sides in the film plane. During the fastening of the carrier film TF on the upper side RO of the frame SR, mechanical surface contact pressure and/or elevated temperature may be applied. The carrier film TF is fastened using an edge surface area RF on the rigid frame SR and its inner surface IF spans the inner area delimited by the inner contour IK of the frame SR. A lower side FU of the carrier film TF faces toward the inner area IB. A layer structure SA is deposited on the upper side FO of the carrier film, facing toward the frame SR or the inner area IB, which has at least one conductive layer, which is structured in the surface, made of an electrically conductive material, in particular a metal. The layer structure forms structures of flexible circuit configurations over the inner surface IF of the carrier film TF. In FIG. 1, multiple such flexible circuit configurations FS over the inner surface IF of the carrier film are shown by their contours. Advantageously, multiple such flexible circuits FS may be produced simultaneously and cost-effectively over a common carrier film as the underlay. After production of the layer structure SA for the structures of the flexible circuit configuration over the inner surface IF and optionally further method steps, such as implementing contact surfaces and/or equipping with discrete components, the one or typically the multiple flexible circuit configurations FS may be cut out of the inner surface IF, for which purpose a cutting tool TW is indicated as representative in FIG. 2. For such cutting of one or more flexible circuit configurations FS out of the composite of carrier film TF and layer structure SA in the area of the inner surface IF, mechanical cutting tools, stamping tools, or a focused laser beam along the contour of a flexible circuit configuration may be used, for example.

At 0.3-5 mm, the thickness of the frame is typically a multiple of the thickness of the carrier film, which, at 0.01-0.2 mm, is in turn substantially greater than the layer thicknesses of individual layers of the layer structure at 0.001-0.01 mm.

Figure 4A:
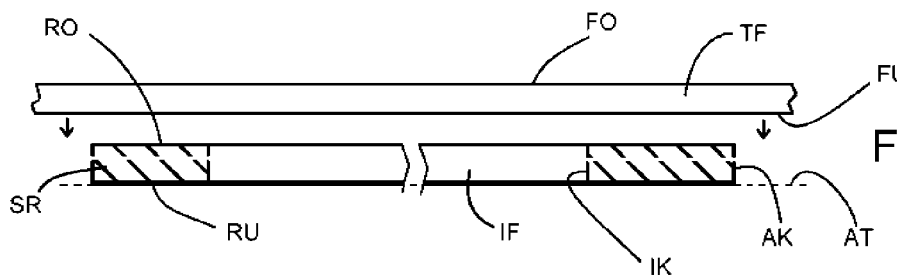
FIG. 4A shows a rigid frame being overlaid by a carrier film in the initial steps of a preferred production method.
Figure 4B:
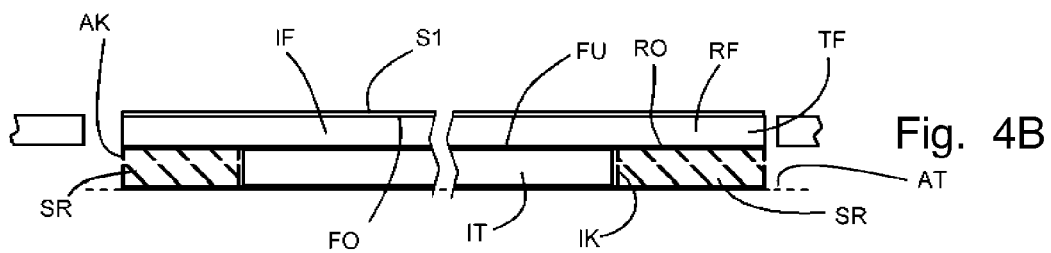
FIG. 4B shows protruding parts of the carrier film being removed after fastening the carrier film to the rigid frame.
Figure 4C:
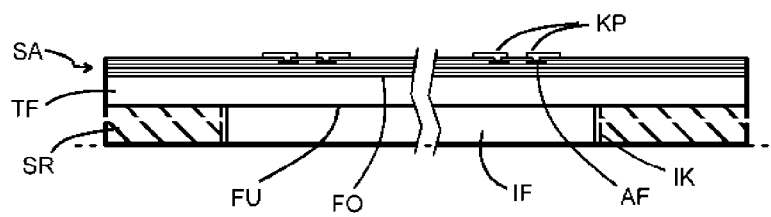
FIG. 4C shows the finished layer structure attached to the upper side of the carrier film in the final steps of the preferred production method.

FIGS. 4A-4C shows individual method steps of a preferred embodiment of the production method according to the invention. In FIG. 4A, the rigid frame SR is laid on an indicated support surface AT, such as a worktable, and a carrier film TF has its lower side FU facing toward the upper side RO of the frame SR. The carrier film TF is applied, advantageously with elastic pre-tension in the film plane, using its lower side FU to the upper side RO of the frame SR and fastened to the frame, in the case of gluing as the type of fastening, the lower side FU of the film and/or the upper side RO of the frame SR being able to be coated using an adhesive material. The inner area IB inside the frame SR is free and the film TF fastened on the upper side RO of the frame freely spans this inner area IB using its inner surface IF.

After fastening of the film having edge surfaces RF on the upper side RO of the frame SR, as indicated in FIG. 4B, parts of the carrier film protruding beyond the outer contour AK of the frame SR can be removed.

For further method steps, the inner part IT shown in FIG. 3 can advantageously be laid in the inner area IB of the frame SR. When the frame SR and the inner part IT are supported on a common level support surface AT, the upper side of the inner part IT facing away from the support surface AT is in a common plane with the upper side RO of the frame SR. The carrier film, which spans the inner area IB using its inner surface IF, can thus advantageously be supported from below and offer a uniform level upper side FO for further method steps.

In following method steps, at least one, preferably multiple layers are deposited on the upper side FO of carrier film TF, of which a first layer S1 is shown in FIG. 4B.

In FIG. 4C, a finished layer structure SA on the upper side FO of the carrier film TF is assumed. The layer structure contains multiple individual layers, of which at least one layer is a flatly structured conductive layer. It is additionally provided in FIG. 4C that an insulating layer is deposited over terminal surfaces AF implemented in a structured conductive layer. Contact surfaces KP, which are located on the upper side OS of the layer structure, are electrically connected to the terminal surfaces AF via through contacts through openings in this insulating layer. The contact surfaces KP may be used, for example, for discrete components to be connected to the flexible circuit configuration, for applying solder bumps, for contacting bonding wires, or for soldering the flexible circuit configuration to counter surfaces of the circuit board. Through the support of the lower side FU of the carrier film TF by the inner part IT, as long as the flexible circuit configuration is fastened as part of the composite of the carrier film TF to the layer structure SA on the frame SR, method steps having mechanical effect may also occur on the upper side OS of the layer structure.

In particular, however, it is ensured by the fastening of the carrier film TF on the rigid frame SR during the production method that no distortion of the film having layers of the layer structure deposited thereon occurs and therefore different surface structures, which are produced in successive method steps in successive layers, are each oriented precisely and correctly relative to one another. An orientation within a manufacturing device can particularly be provided by positioning references at or on the rigid frame SR and/or the edge surface area of the carrier film which is fixedly connected to the frame. Through such positioning references, a manufacturing module can also be removed from a manufacturing device readily between various method steps of the production method and also exchanged between various manufacturing devices. In particular a manufacturing module of the type shown in FIG. 1 can also be relayed, as an intermediate product of a producer creating the layer structure SA on the carrier film TF for further processing up to the finished flexible circuit configuration, to a second producer. Such a manufacturing module can therefore represent a unit which can be handled independently. The inner part IT is advantageously a component of the manufacturing module.

Figure 5A:
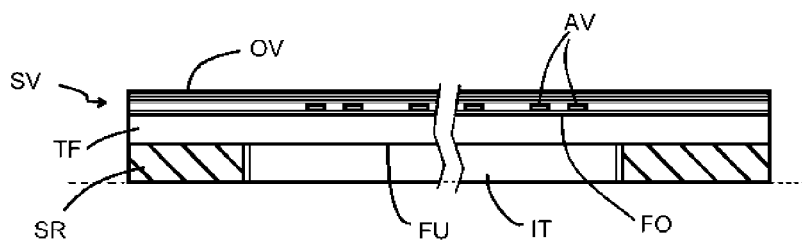
FIG. 5A shows a finished layer structure with terminal surfaces interposed between the layer structure and the carrier film in a variation of the production method.
Figure 5B:
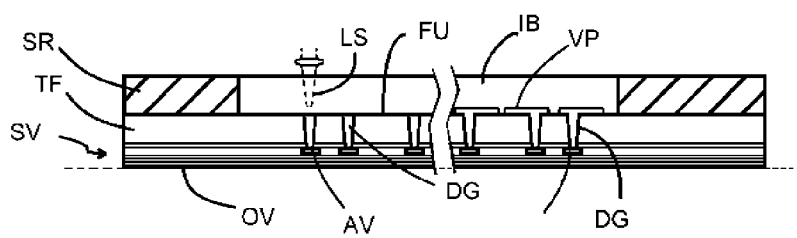
FIG. 5B shows the finished layer structure of FIG. 5A inverted for the installation of through contacts to the terminal surfaces in the variation of production method.

A variant of a production method is outlined in FIGS. 5A-5B, in which terminal surfaces AV are created in a layer directly on or close to the upper side FO of a carrier film TF in a layer structure SV, which is deposited on the upper side FO of a carrier film TF. After production of the terminal surfaces AV, preferably after production of the entire layer structure SV optionally having further layers, the manufacturing module having the side OV of the layer structure facing away from the frame SR, is laid inverted on a support AT, so that the free inner area IB faces away from the support AT.

Perforations DG are created through the carrier film through the inner area IB from the lower side FU of the carrier film TF, which extend up to the terminal surfaces AV in the layer structure. The perforations DG are therefore also continued through layers of the layer structure optionally lying between the carrier film and the terminal surfaces AV. The production of such perforations can be performed by photolithography or, as indicated in FIG. 5, preferably using a focused laser beam LS, which ablates material in spots from the carrier film TF and optionally layers of the layer structure SV.

Through contacts may then be produced by metal deposition in the perforations DG from the lower side FU of the carrier film up to the terminal surfaces AV of the layer structure. Such perforations may particularly be used for the purpose, in the case of metal plating over the entire surface on the lower side FU of the carrier film, of setting the terminal surfaces AV, which are contacted through the through contacts through the perforations DG, to a common potential. In another embodiment, contact surfaces VP may be created on the lower side FU of the carrier film by structured deposition of conductor material, in particular metal, which contact surfaces are connected individually or in groups to terminal surfaces VA of the layer structure via the through contacts through the perforations DG. Such contact surfaces VP may be provided for the same functions as the contact surfaces KP according to FIG. 4C.

The features specified above and in the claims and the features which can be inferred from the drawings can be implemented advantageously both individually and also in various combinations. The invention is not restricted to the described exemplary embodiments, but rather can be altered in many ways in the scope of knowledge in the art.

The invention claimed is:

1. A manufacturing module for producing a flexible circuit configuration, comprising:
    a frame defining an open inner area delimited by an inner contour of the frame;
    a flexible carrier film fastened to the frame, the flexible carrier film spanning the inner area of the frame; and
    a layer structure having at least one structured conductive layer on the flexible carrier film;
    wherein the layer structure for the flexible circuit configuration lies on the carrier film over the inner area of the frame.

2. The manufacturing module according to claim 1, further comprising an inner part which can be laid in the inner area is part of the manufacturing module.

3. The manufacturing module according to claim 2, wherein the frame and the inner part have the same thickness.

4. The manufacturing module according to claim 2, wherein the frame and the inner part comprise the same material.

5. The manufacturing module according to claim 4, wherein frame and inner part comprise stainless steel.

* * * * *